United States Patent
Soufi et al.

(10) Patent No.: US 7,424,418 B1
(45) Date of Patent: Sep. 9, 2008

(54) METHOD FOR SIMULATION WITH OPTIMIZED KERNELS AND DEBUGGING WITH UNOPTIMIZED KERNELS

(75) Inventors: Mohamed Soufi, Santa Clara, CA (US); William K. Lam, Newark, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 519 days.

(21) Appl. No.: 10/751,307

(22) Filed: Dec. 31, 2003

(51) Int. Cl.
- G06F 17/50 (2006.01)
- G06F 9/45 (2006.01)
- G06G 7/62 (2006.01)

(52) U.S. Cl. ............... 703/14; 703/13; 716/2; 716/5; 716/18

(58) Field of Classification Search ............. 703/13–14; 716/5, 2, 18; 326/10
See application file for complete search history.

(56) References Cited

U.S. PATENT DOCUMENTS

| | | | | |
|---|---|---|---|---|
| 6,009,256 A | * | 12/1999 | Tseng et al. | 703/13 |
| 6,088,821 A | * | 7/2000 | Moriguchi et al. | 714/724 |
| 6,108,494 A | * | 8/2000 | Eisenhofer et al. | 703/14 |
| 6,496,972 B1 | * | 12/2002 | Segal | 716/18 |
| 6,510,541 B1 | * | 1/2003 | Fujiwara et al. | 716/5 |
| 6,785,873 B1 | * | 8/2004 | Tseng | 716/4 |

* cited by examiner

Primary Examiner—Paul L Rodriguez
Assistant Examiner—Juan C Ochoa
(74) Attorney, Agent, or Firm—Osha Liang LLP (57) ABSTRACT

A method for providing verification for a first simulation image involves removing nodes from the first simulation image to produce an optimized image and an optimized nodes image, simulating the optimized image, invoking the optimized nodes image if debugging is selected, reconstructing a second simulation image using the optimized image and the optimized nodes image, simulating the second simulation image to gather simulation data, and debugging the first simulation image using simulation data.

20 Claims, 5 Drawing Sheets

METHOD FOR SIMULATION WITH OPTIMIZED KERNELS AND DEBUGGING WITH UNOPTIMIZED KERNELS

BACKGROUND OF INVENTION

Modern high performance microprocessors have an ever-increasing number of circuit elements and an ever-rising clock frequency. Also, as the number of circuits that can be used in a CPU has increased, the number of parallel operations performed by the circuits has risen. Examples of efforts to create more parallel operations include increased pipeline depth and an increase in the number of functional units in super-scalar and very-long-instruction-word architectures. As CPU performance continues to increase, the result has been a larger number of circuits switching at faster rates. Thus, from a circuit design perspective, important considerations such as the time needed to complete a circuit simulation and the time needed to debug the CPU are taken into account.

As each new CPU design uses more circuits and circuit elements, each often operating at increased frequencies, the time required to simulate the circuit design increases. Due to the increased time for simulation, the number of tests, and consequently the test coverage, may decrease. In general, the result has been a dramatic increase in the number of logic errors that escape detection before the CPU is manufactured.

Circuit simulation may occur at a "switch-level." Switch-level simulations typically include active circuit elements (e.g., transistors) and passive circuit elements (e.g., resistors, capacitors, and inductors). Circuit simulation also may occur at a "behavioral level." Behavioral level simulations typically use a hardware description language (HDL) that determines the functionality of a single circuit element or group of circuit elements.

A typical behavioral level simulation language is "Verilog," which is an Institute of Electrical and Electronics Engineers standard. Verilog HDL uses a high-level programming language to describe the relationship between the input and output of one or more circuit elements. Verilog HDL describes on what conditions the outputs should be modified and what effect the inputs have. Verilog HDL programs may also be used for logic simulation at the "register transfer level" (RTL). RTL is a programming language used to describe a circuit design. The RTL programs written in Verilog go through a verification process. During this process, the Verilog design is parsed and checked for RTL style conformance by a style checker.

Using the Verilog HDL, for example, digital systems are described as a set of modules. Each module has a port interface, which defines the inputs and outputs for the module. The interface describes how the given module connects to other modules. Modules can represent elements of hardware ranging from simple gates to complete systems. Each module can be described as an interconnection of sub-modules, as a list of terminal elements, or a mixture of both. Terminal elements within a module can be described behaviorally, using traditional procedural programming language constructs such as "if" statements and assignments, and/or structurally as Verilog primitives. Verilog primitives include, for example, truth tables, Boolean gates, logic equation, pass transistors (switches), etc.

HDL simulations, written using HDL languages, may be event-driven or cycle-based. Event-driven simulators are designed to eliminate unnecessary gate simulations without introducing an unacceptable amount of additional testing. Event-driven simulators propagate a change in state from one set of circuit elements to another. Event-driven simulators may record relative timing information of the change in state so that timing and functional correctness may be verified. Event-driven simulators use event queues to order and schedule the events. Event-driven simulators process and settle all the active events in a time step before the simulator can move to the next time step.

Cycle-based simulators also simulate a change in state from one set of circuit elements to another; however, the state of an entire system is evaluated once each clock cycle. Cycle-based simulators are applicable to synchronous digital systems and may be used to verify the functional correctness of a digital design. Cycle-based simulators abstract away the timing details for all transactions that do not occur on a cycle boundary. Cycle-based simulators use algorithms that eliminate unnecessary calculations to achieve improved performance in verifying system functionality. Discrete component evaluations and re-evaluations are typically unnecessary upon the occurrence of every event.

Cycle-based simulators typically have enhanced performance. Depending on the particular options used, cycle-based simulators can offer five to ten times improvement in speed and one-fifth to one-third the memory utilization over conventional, event-driven simulators. Some cycle-based simulators also offer very fast compile times. For very large designs, the reduced memory requirements of cycle-based simulators allow a design team to simulate a design on almost every workstation on their network.

Figure 1:
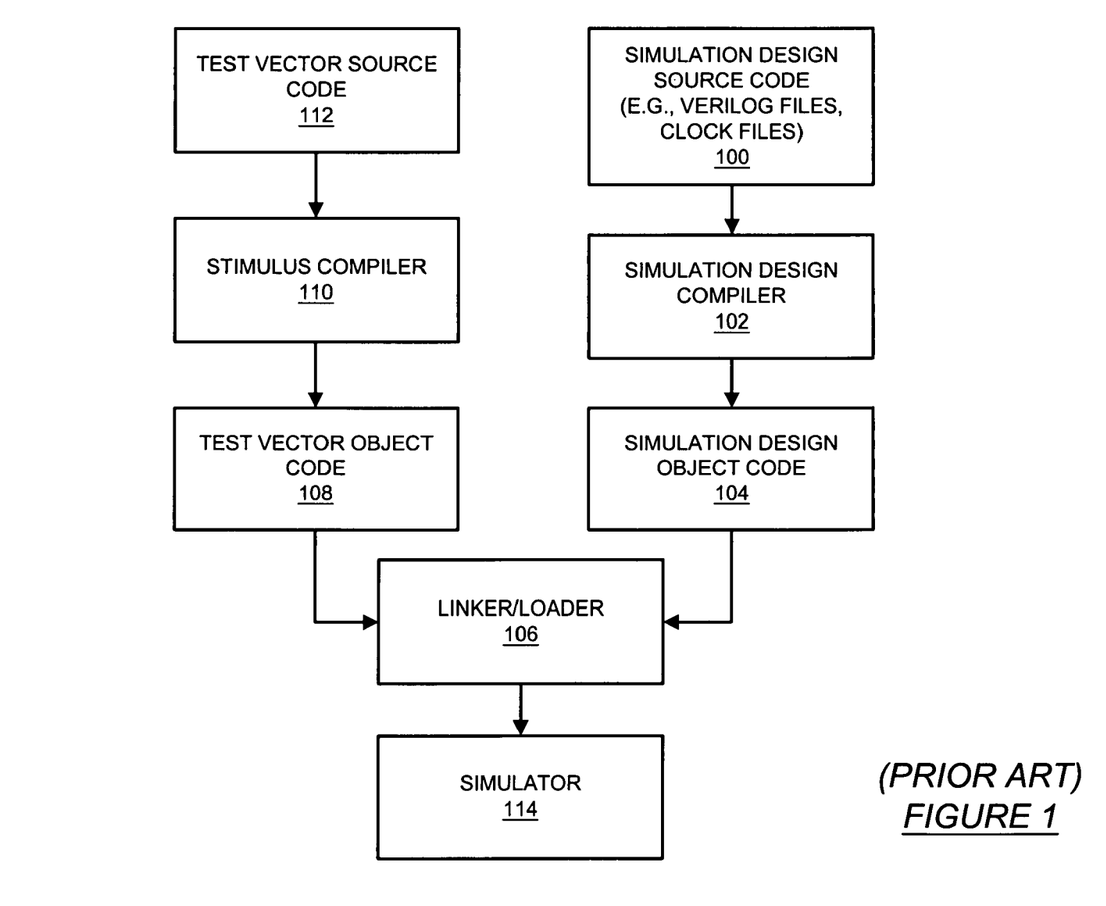
FIG. 1 illustrates a flow diagram of a typical simulation system.

A typical simulation system (e.g., cycle-based simulator) is shown in FIG. 1. A simulation design source code (100), which includes, for example, Verilog files, clock files, etc., is an input into a simulation design compiler (102). The simulation design compiler (102) statically generates simulation design object code (104). A linker/loader (106) takes as input the simulation design object code (104) and a test vector object code (108), which is output from a stimulus compiler (110). Test vector source code (112) is input into the stimulus compiler (110).

The test vector object code (108) provides stimulus in the form of input signal values for the simulation, which is run on the simulator (114). For example, if a particular module included in the simulation design object code (104) includes an AND gate, the test vector object code (108) may provide stimulus in the form of a signal value equal to "1" to be sent to a pin of the AND gate at a particular time. The test vector object code (108) may also include expected outputs for signal values stimuli.

The test vector object code (108) may include multiple test vectors. For example, a collective test vector may include a first test vector to test a first group of modules of the simulation design object code (104), and a second test vector to test a second group of modules of the simulation design object code (104).

Using the test vector (108) and the simulation design object code (104), the linker/loader (106) generates and loads an executable code (i.e., an executable program or simulation image) into the memory of simulator (114), where the simulation is performed. Depending on implementation, the simulator may use typical, "standard" computer architectures, such as may be found in a workstation, or may use other, "non-standard" computer architectures, such as computer architectures developed specifically for simulation or specifically for verification of circuit design, e.g., a massively parallel processing machine.

SUMMARY OF INVENTION

In general, in one aspect, the invention relates to a method for providing verification for a first simulation image. The method comprises removing nodes from the first simulation image to produce an optimized image and an optimized nodes image, simulating the optimized image, invoking the optimized nodes image if debugging is selected, reconstructing a second simulation image using the optimized image and the optimized nodes image, simulating the second simulation image to gather simulation data, and debugging the first simulation image using simulation data.

In general, in one aspect, the invention relates to a computer system for providing verification for a simulation image. The computer system comprises a processor, a memory, a storage device, and software instructions. The software instructions are stored in the memory for enabling the computer system to remove nodes from the first simulation image to produce an optimized image and an optimized nodes image, simulate the optimized image; invoke the optimized nodes image if debugging is selected, reconstruct a second simulation image using the optimized image and the optimized nodes image, simulate the second simulation image to gather simulation data, and debug the first simulation image using simulation data.

In general, in one aspect, the invention relates to a system for verifying a first simulation image. The system comprises an optimizer tool providing functionality to optimize the second simulation image into an optimized image and an optimized nodes image, a test vector providing an input signal value for a component in at least one selected from the group consisting of the optimized image and a second simulation image, and a reconstructor tool of a testbench providing functionality to reconstruct the second simulation image using the optimized image and the optimized nodes image, if debugging is selected, wherein the testbench provides functionality to verify at least one selected from the group consisting of the optimized image and the second simulation image using the test vector.

In general, in one aspect, the invention relates to an apparatus providing verification for a first simulation image. The apparatus comprises means for removing nodes from the first simulation image to produce an optimized image and an optimized nodes image, means for simulating the optimized image, means for invoking the optimized nodes image if debugging is selected, means for reconstructing a second simulation image using the optimized image and the optimized nodes image, means for simulating the second simulation image to gather simulation data, and means for debugging the first simulation image using simulation data.

Other aspects and advantages of the invention will be apparent from the following description and the appended claims.

DETAILED DESCRIPTION

Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Manufacturers of highly complex circuit designs, such as Central Processing Units (CPU's), typically require verification of simulation design objects in order to verify that the circuits are designed properly. Typically, verification is used to compare a first version of the design to a second version of the design. Often the first version of the design corresponds to a high-level description of the design, such as an Instruction Set Simulator (ISS) model, and the second version corresponds to a lower level design, such as design implemented at the register level (e.g., an RTL design). Typically, one of the versions already has been verified, and serves as a specification, or reference, against which the other version is verified. In the above scenario, the high level design typically serves as the reference version.

Figure 2:
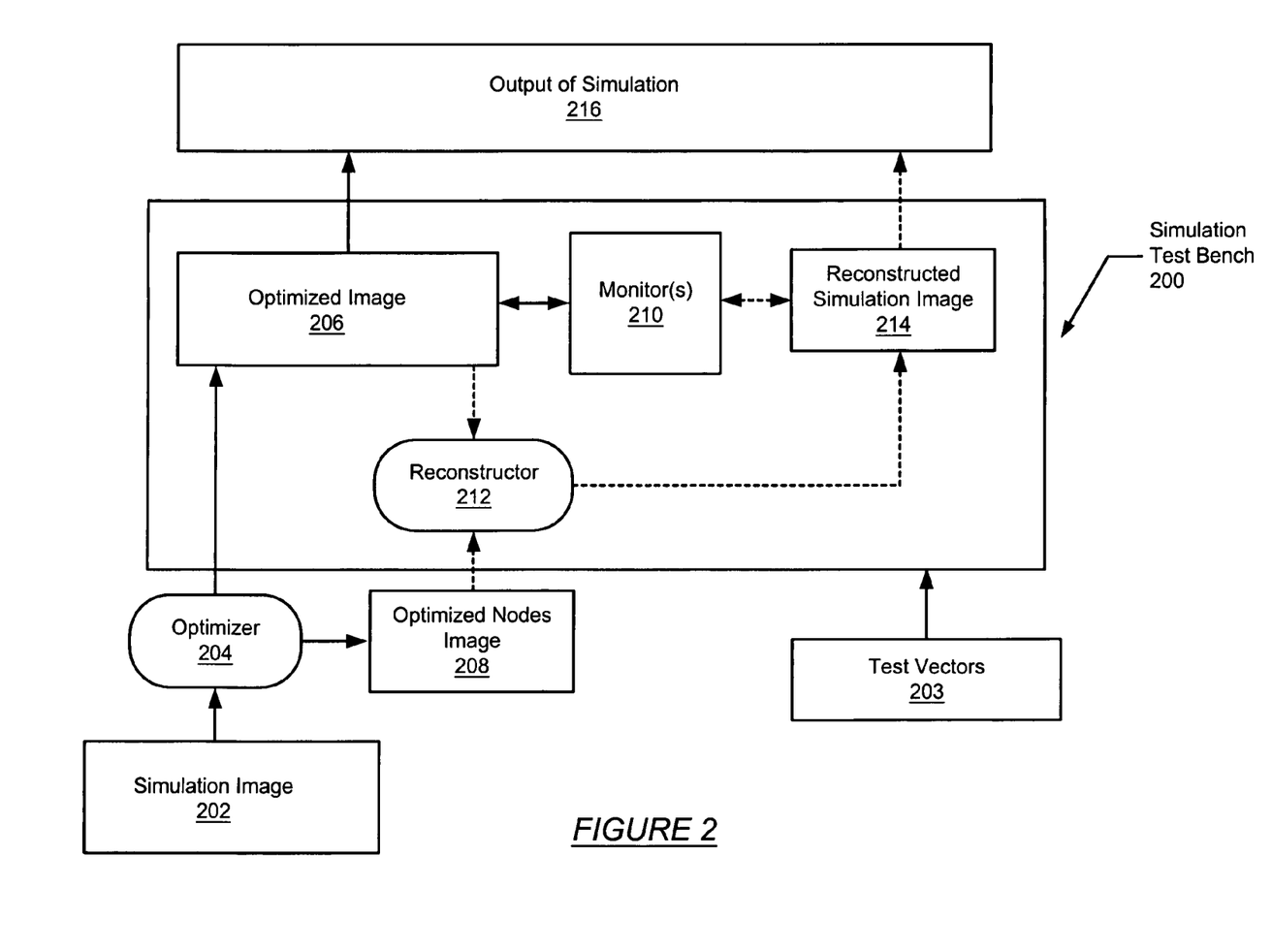
FIG. 2 illustrates a flow diagram of a design verification system in accordance with one or more embodiments of the invention.

FIG. 2 illustrates a flow diagram of a design verification system using an optimized design, in accordance with one or more embodiments of the invention. Initially, a simulation design (not shown) and a corresponding RTL design (not shown) are created. The RTL design is coded to produce a simulation image (202). In accordance with one embodiment of the invention, the simulation image (202) is then input into an optimizer tool (204), in which the simulation image (202) is analyzed and optimized as described below.

The output of this optimizer tool (204) is a fully optimized image (206) and an image of each optimized node (208) (e.g., a list of optimized nodes and information about how to compute the optimized nodes from the optimized image (206)). At this stage, the optimized image (206) is linked (i.e., the binary files corresponding to RTL design are linked). The optimized image (206) is then loaded into a Simulation Test Bench (STB) (200) along with one or more test vectors (203).

The optimized image (206) is then executed, with the test vectors serving as input to the optimized image (206). Simulation of the optimized image (206) continues until debugging is requested by the user. When debugging is requested, a call is made to a reconstructor tool (212) to invoke the optimized nodes image (208). The optimized image (206) and the optimized nodes image (208) are provided as input to a reconstructor tool (212). The reconstructor tool (212) uses the information provided with the optimized nodes image (208) to restore the optimized node to produce a reconstructed simulation image (214) (i.e., the original full circuit).

For the purposes of RTL design verification, one or more monitor(s) (210) typically includes functions to retrieve a reference value against which the value of the corresponding RTL design component of the optimized image (206) (or reconstructed simulation image (214)) is compared. If the value of the corresponding RTL design component matches the reference value, then the STB (200) resumes execution of the optimized image (206) (or reconstructed simulation image (214)). Otherwise, the STB (200) typically outputs an error message, and then resumes execution of the optimized image (206).

The reference value is denoted as Output of Simulation (216) in FIG. 2. Depending on implementation of the RTL design verification, the Output of Simulation (216) may be generated prior to execution of the optimized image (206) (or reconstructed simulation image (214)) or generated concurrently on a cycle-by-cycle basis, as is typically seen in prior art ad hoc design verification methods.

Simulation performance is becoming key for a successful design verification procedure. In late stages of a design schedule, finding bugs in the simulation design requires running simulation for long periods of time (many cycles). In fact, the simulation design at these stages becomes mature and finding bugs is more difficult. Occasionally, bugs may even be found after the "official tape out date." Finding these bugs requires tremendous simulation performance.

One of the classic strategies used for increasing performance is the use of so-called "optimized images." These optimized simulation images are generated during compilation of a simulation design using tools to remove nodes in the simulation design to concentrate on one or more of its circuit configurations. A configuration is a particular application of the simulation design in which only a subset of the circuit design features is likely to be exercised. In this case, the unexercised features constitute removable nodes.

Once a node is considered removable, the node is generally never needed again for this particular configuration of the simulation design. For example, a direct memory access (DMA) chip is not needed in a configuration test where input/output functionality is being tested. Assuming a design is free of removable nodes, a node still does not necessarily need to be simulated if it is not "directly observable" and can be reconstructed from other nodes. However, the node may be needed for other configurations or during debugging.

Referring still to FIG. 2, if the STB (200) is a hardware-based simulation system, the STB (200) is generally able to execute the RTL design in a very efficient manner, in part, because the simulation image has been optimized. When a simulation image has been optimized for efficiency, particular nodes of the design are often optimized out of the simulation image that is eventually executed during simulation. Debugging the simulation design may be challenging if a user attempts to monitor a node of the simulation image that has been optimized out.

Nodes that are optimized out of a simulation image are referred to as "optimizable nodes." One example of optimizable nodes is redundant logic, e.g., a portion of a circuit in a fault tolerant design. Another example is unobservable nodes (or not "directly observable" nodes), e.g., a scan chain and a large amount of circuitry that does not directly affect verification output. A third example of an optimizable node is a dangling node. Dangling nodes are nodes that are either not driven or not driving any node. This type of node can be an artifact of design changes that the user forgot to remove, or resulting from a user simulating a configuration of the design where such a node does not contribute to any functionality.

As discussed above, not simulating these optimizable nodes results in better overall simulation performance. However, investigating a bug using a modified design where some of the key nodes have been optimized out may also create a challenge during debugging.

Figure 3A:
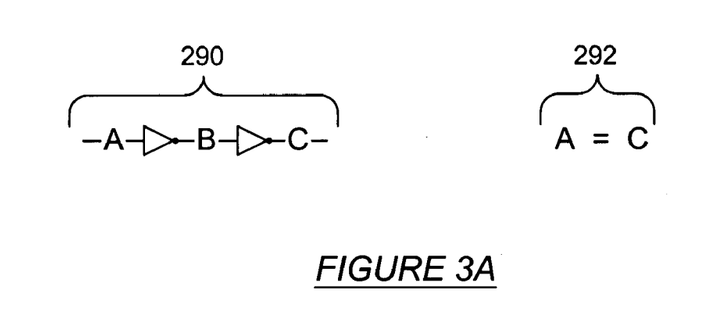
FIGS. 3A and 3B illustrate circuit diagrams in accordance with one or more embodiments of the invention.
Figure 3B:
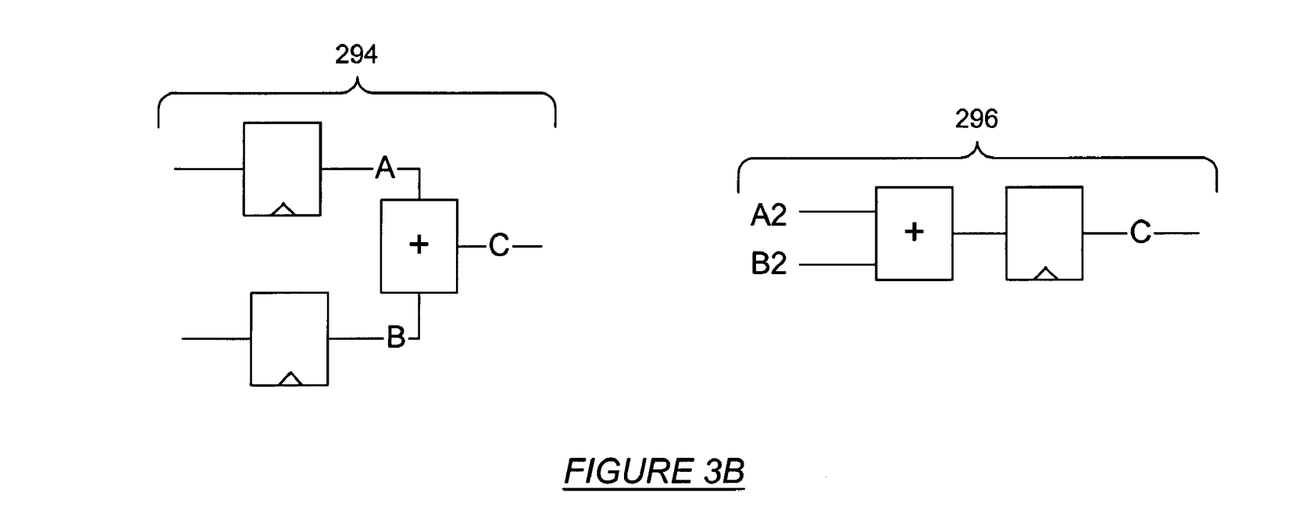

FIGS. 3A and 3B illustrate two examples of optimizing nodes out of a simulation design in accordance with an embodiment of the invention. In FIG. 3A, the original logic (290) involves unobservable nodes, where A and C are directly observable and B is not. In this example, B is candidate for optimization. If the logic A to C through B is reorganized into the following, simulation-friendly implementation: A=C, the logic (292) would be considered optimized.

In FIG. 3B, the original logic (294) shows nodes A and B are not directly observable and C is directly observable. To optimize the design, the flip-flop driving A and B is moved to the output of the adder resulting in a flip-flop driving C. The optimized logic (296) is the result of moving sequential elements, known as sequential re-timing. Re-timing may be used by optimization processes to improve simulation performance.

In one embodiment of the present invention, the invention relates to keeping track of optimized nodes and how the optimized nodes can be computed from the optimized simulation design. During simulation of the optimized design, the optimized image is used for full simulation speed. However, when debugging is requested, the previously silent optimized nodes are invoked and simulation is performed on both the optimized image and on the optimized nodes allowing the debugging to proceed with consistency and reliability.

Figure 4:
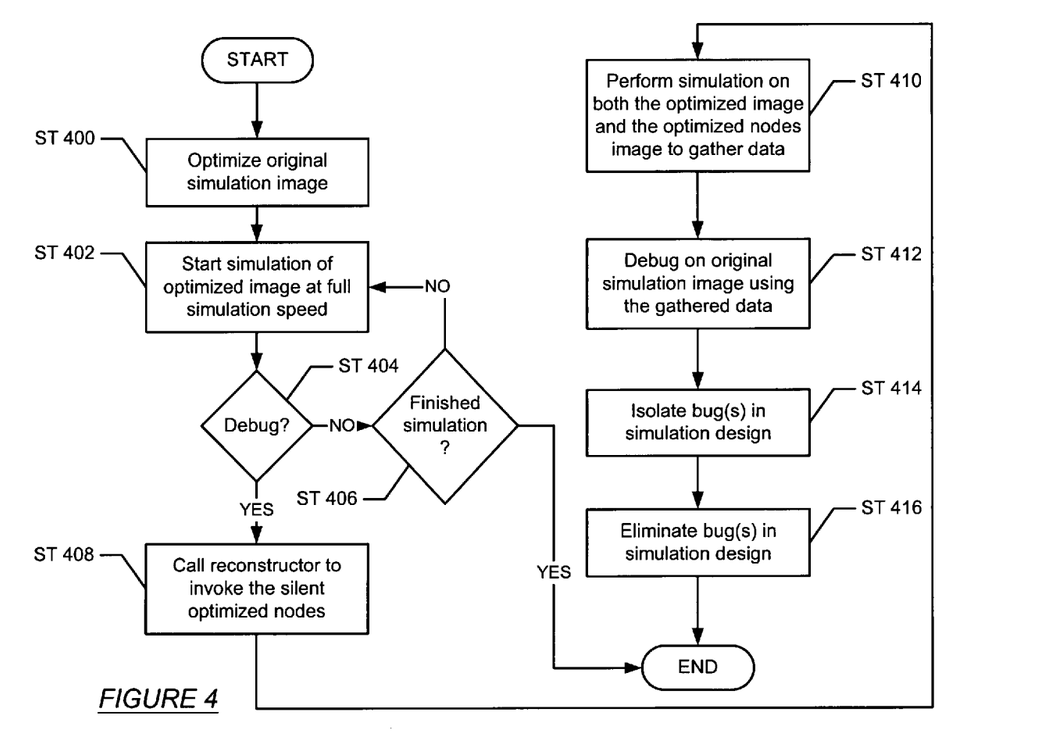
FIG. 4 illustrates a flow chart of a design verification in accordance with one or more embodiments of the invention.

FIG. 4 illustrates a flow chart of a design verification in accordance with one or more embodiments of the present invention. Initially, an original simulation image is optimized (Step 400). In accordance with one embodiment of the invention, a simulation design is input into an optimizer tool, in which the simulation is analyzed and optimized in a similar manner as described above in Examples 1 and 2.

For example, referring back to FIG. 3B, the optimizer tool determines that nodes A and B can be derived from nodes A2, B2. When A2 and B2 are further optimized out by the optimizer tool, a reference to A2 and B2 must be maintained, so that A and B can later be reconstructed. Therefore, the output of this optimization tool described above is a fully optimized design image and an image of any optimized nodes (e.g., a list of optimized nodes and information about how to compute the optimized nodes from the optimized design image).

Returning to FIG. 4, the verification procedure continues by starting simulation of the optimized image at full simulation speed (Step 402). Simulation of the optimized image continues until debugging is requested by the user (Step 404) or the simulation (and/or debugging) is complete (Step 406). When debugging is requested, a call is made to a reconstructor tool to invoke the optimized nodes image (Step 408).

In accordance with one or more embodiments of the present invention, an optimized image of the design and an image of the optimized nodes are provided as input to a reconstructor tool. The reconstructor uses the information provided with the image of the optimized nodes to restore the optimized node to produce the simulation image (i.e., the original full circuit).

Next, simulation is performed on the reconstructed simulation image (i.e., both the optimized image and the optimized nodes image) to gather the necessary debugging information (Step 410). One skilled in the art will appreciate that only a portion of an optimized nodes image may be used to reconstruct the simulation image.

Using the gathered debugging data, debugging is performed on the reconstructed simulation image (Step 412) until the simulation or debugging is complete. By debugging this image, one or more bugs are typically isolated in the simulation design (Step 414). Once isolated, the bugs are eliminated from the simulation design (Step 416), typically using techniques well known in the art.

Figure 5:
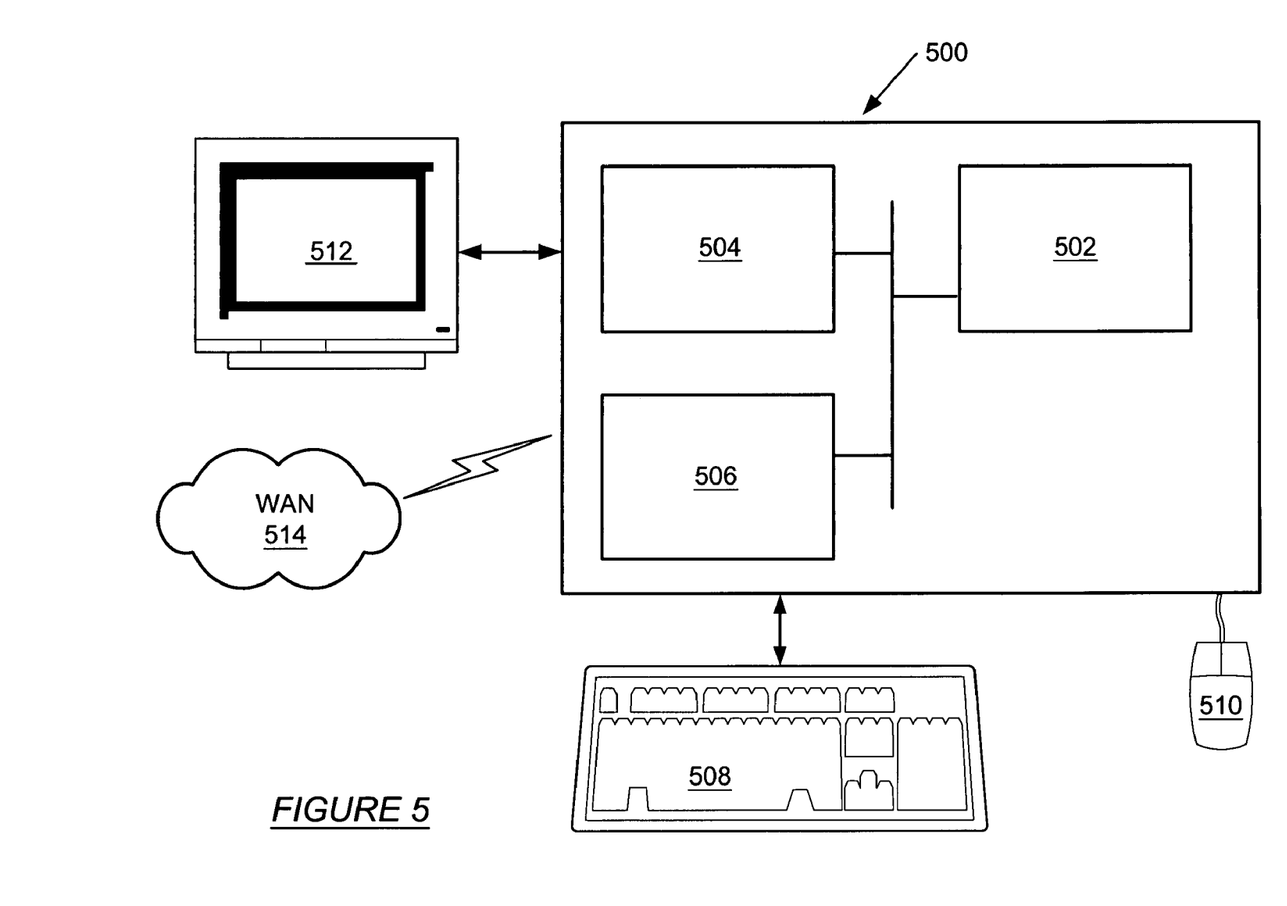
FIG. 5 illustrates a typical networked computer system.

The invention may be implemented on virtually any type computer regardless of the platform being used. For example, as shown in FIG. 5, a typical networked computer system (500) includes a processor (502), associated memory (504), a storage device (506), and numerous other elements and functionalities typical of today's computers (not shown). The networked computer (500) may also include input means, such as a keyboard (508) and a mouse (510), and output means, such as a monitor (512). The networked computer system (500) is connected to a wide area network (514) (e.g., the Internet) via a network interface connection (not shown). Those skilled in the art will appreciate that these input and output means may take other forms. Further, those skilled in the art will appreciate that one or more elements of the aforementioned computer (500) may be located at a remote location and connected to the other elements over a network.

Embodiments of the present invention may include one or more of the following advantages. In one aspect, the ability to optimize simulation designs, and still monitor nodes that are optimized out is provided, without sacrificing simulation performance. In one aspect, verification performance can be increased because a smaller circuit is being simulated. In one aspect, productivity can be increased because information of all user visible nodes is automatically retrieved from the optimized circuit. In one aspect, human errors can be reduced by automatically removing redundant nodes, dangling nodes, and unobservable nodes. Those skilled in the art will appreciate that the present invention may include other advantages and features.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for providing verification for a simulation image, comprising:
    removing nodes from the simulation image to produce an optimized image and an optimized nodes image, wherein the optimized nodes image comprises information about the nodes removed from the simulation image;
    simulating the optimized image; and
        simulating a reconstructed simulation image to gather simulation data, wherein the reconstructed simulation image comprises the optimized image and the optimized nodes image;
        debugging the simulation image using simulation data; and
        verifying one selected from a group consisting of the optimized image and the reconstructed simulation image.

2. The method of claim 1, wherein the simulation image and the reconstructed simulation image comprise a register transfer level design.

3. The method of claim 2, wherein debugging comprises comparing a reference value to a value of a corresponding register transfer level design component of at least one selected from the group consisting of the optimized image and the reconstructed simulation image.

4. The method of claim 1, wherein the optimized nodes image comprises one node selected from a group consisting of a redundant node, an unobservable node, and a dangling node.

5. The method of claim 1, wherein the optimized nodes image comprises a list of optimized nodes and information about how to compute the optimized nodes image from the optimized image.

6. The method of claim 1, further comprising:
    isolating and eliminating a bug in the first simulation image using simulation data.

7. The method of claim 1, wherein removing nodes from the simulation image further comprises moving at least one sequential element to use an input of the optimized nodes image as an output of the optimized nodes image.

8. A computer system for providing verification for a simulation image, comprising:
    a processor;
    a memory;
    a storage device; and
    software instructions stored in the memory for enabling the computer system to:
        remove nodes from the simulation image to produce an optimized image and an optimized nodes image, wherein the optimized nodes image comprises information about the nodes removed from the simulation image;
        simulate the optimized image; and
            simulate a reconstructed simulation image to gather simulation data, wherein the reconstructed simulation image comprises the optimized image and the optimized nodes image;
            debug the simulation image using simulation data; and
            verify one selected from a group consisting of the optimized image and the reconstructed simulation image.

9. The computer system of claim 8, wherein the simulation image and the reconstructed simulation image comprise a register transfer level design.

10. The computer system of claim 9, wherein debugging comprises comparing a reference value to a value of a corresponding register transfer level design component of at least one selected from the group consisting of the optimized image and the reconstructed simulation image.

11. The computer system of claim 8, wherein the optimized nodes image comprises one node selected from a group consisting of a redundant node, an unobservable node, and a dangling node.

12. The computer system of claim 8, wherein the optimized nodes image comprises a list of optimized nodes and information about how to compute the optimized nodes image from the optimized image.

13. The computer system of claim 8, further comprising software instructions to:
    isolate and eliminate a bug in the simulation image using simulation data.

14. The computer system of claim 8, wherein the software instructions to remove nodes from the simulation image further comprise software instructions to move at least one sequential element to use an input of the optimized nodes image as an output of the optimized nodes image.

15. A computer system for verifying a simulation image, comprising: a processor; a memory; a storage device;
    an optimizer tool providing functionality to remove nodes from the first simulation image to produce an optimized image and an optimized nodes image, wherein the optimized nodes image comprises information about the nodes removed from the simulation image;
    a test vector providing an input signal value for a component in at least one selected from a group consisting of the optimized image and a reconstructed simulation image; and a reconstructor tool of a testbench providing functionality to provide the reconstructed simulation image using the optimized image and the optimized nodes image when debugging is selected, wherein the testbench provides functionality to:
simulate the reconstructed simulation image to gather simulation data,
debug simulation image using simulation data, and
verify one selected from the group consisting of the optimized image and the reconstructed simulation image using the test vector.

16. The system of claim 15, wherein the simulation image and the reconstructed simulation image comprise a register transfer level design.

17. The system of claim 16, wherein debugging comprises comparing a reference value to a value of a corresponding register transfer level design component of at least one selected from the group consisting of the optimized image and the reconstructed simulation image.

18. The system of claim 15, wherein the optimized nodes image comprises one node selected from a group consisting of a redundant node, an unobservable node, and a dangling node.

19. The system of claim 15, wherein the optimized nodes image comprises a list of optimized nodes and information about how to compute the optimized nodes image from the optimized image.

20. An apparatus providing verification for a simulation image, comprising:
means for removing nodes from the simulation image to produce an optimized image and an optimized nodes image, wherein the optimized nodes image comprises information about the nodes removed from the simulation image;
means for simulating the optimized image; and
means for simulating a reconstructed simulation image to gather simulation data, wherein the reconstructed simulation image comprises the optimized image and the optimized nodes image;
means for debugging the simulation image using simulation data; and
means for verifying one selected from a group consisting of the optimized image and the reconstructed simulation image.

* * * * *

UNITED STATES PATENT AND TRADEMARK OFFICE
CERTIFICATE OF CORRECTION

PATENT NO.       : 7,424,418 B1
APPLICATION NO.  : 10/751307
DATED            : September 9, 2008
INVENTOR(S)      : Mohamed Soufi et al.

Page 1 of 1

It is certified that error appears in the above-identified patent and that said Letters Patent is hereby corrected as shown below:

In Claim 6, Column 8 (line 2), please delete "first";

In Claim 15, Column 8 (line 60), please delete "first".

Signed and Sealed this

Eleventh Day of November, 2008

JON W. DUDAS
*Director of the United States Patent and Trademark Office*